United States Patent
Matsudai et al.

(10) Patent No.: US 7,432,579 B2
(45) Date of Patent: Oct. 7, 2008

(54) SEMICONDUCTOR DEVICE WITH HORIZONTAL MOSFET AND SCHOTTKY BARRIER DIODE PROVIDED ON SINGLE SUBSTRATE

(75) Inventors: Tomoko Matsudai, Tokyo (JP);
Kazutoshi Nakamura, Yokohama (JP);
Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/959,201

(22) Filed: Oct. 7, 2004

(65) Prior Publication Data

US 2005/0098845 A1 May 12, 2005

(30) Foreign Application Priority Data

Oct. 9, 2003 (JP) .............................. 2003-350819

(51) Int. Cl.
*H01L 29/47* (2006.01)
*H01L 29/872* (2006.01)

(52) U.S. Cl. ............... 257/476; 257/471; 257/E29.271; 257/E29.338

(58) Field of Classification Search ................. 257/471, 257/474, 476, E29.271, 311, 338
See application file for complete search history.

(56) References Cited

U.S. PATENT DOCUMENTS

| | | | | |
|---|---|---|---|---|
| 4,300,150 A | * | 11/1981 | Colak | 257/336 |
| 4,811,065 A | | 3/1989 | Cogan | |
| 4,989,058 A | * | 1/1991 | Colak et al. | 257/493 |
| 5,111,253 A | * | 5/1992 | Korman et al. | 257/341 |
| 6,133,107 A | * | 10/2000 | Menegoli | 438/306 |
| 6,683,362 B1 | * | 1/2004 | O et al. | 257/471 |
| 6,784,489 B1 | * | 8/2004 | Menegoli | 257/343 |
| 6,855,998 B2 | * | 2/2005 | Hokomoto | 257/471 |
| 6,870,223 B2 | * | 3/2005 | Kumagai et al. | 257/343 |
| 2003/0127687 A1 | * | 7/2003 | Kumagai et al. | 257/335 |

FOREIGN PATENT DOCUMENTS

| | | |
|---|---|---|
| JP | 6-97447 | 4/1994 |
| JP | 6-132529 | 5/1994 |
| JP | 8-130249 | 5/1996 |
| JP | 9-55507 | 2/1997 |
| JP | 3272242 | 1/2002 |
| JP | 2002-261297 | 9/2002 |
| JP | 2003-23099 | 1/2003 |

* cited by examiner

*Primary Examiner*—Matthew C Landau
(74) *Attorney, Agent, or Firm*—Oblon, Spivak, McClelland, Maier & Neustadt, P.C.

(57) ABSTRACT

A MOS field-effect transistor includes a semiconductor substrate of a first-conductivity type, a semiconductor layer of the first-conductivity type, a source region of a second-conductivity type, a first drain region of the second-conductivity type, a resurf layer of the second-conductivity type provided in the surface of the semiconductor layer between the source region and the first drain region in contact with the first drain region, and having a lower impurity concentration than the first drain region, a gate insulation film, and a gate electrode provided on the gate insulation film between the source region and resurf layer. A Schottky barrier diode includes a second drain region of the second-conductivity type provided in the surface of the semiconductor layer separate from the first drain region in a direction away from the gate electrode, and a Schottky electrode provided on the semiconductor layer between the first and second drain regions.

7 Claims, 5 Drawing Sheets

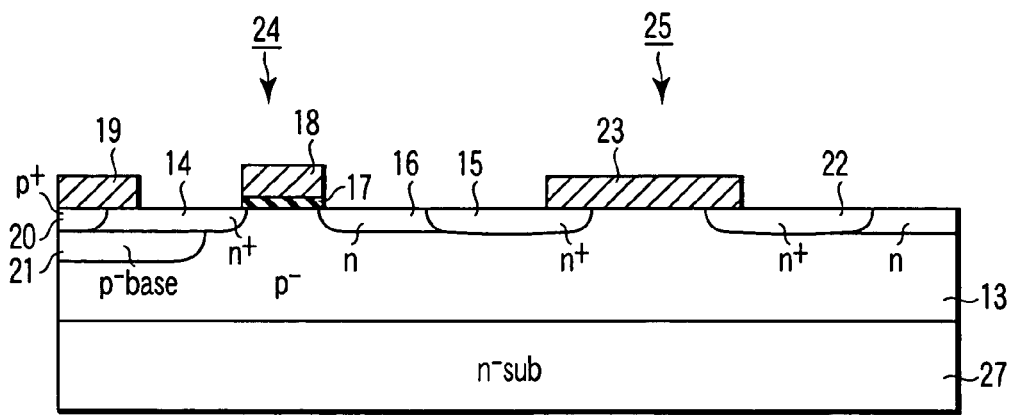
F I G. 4
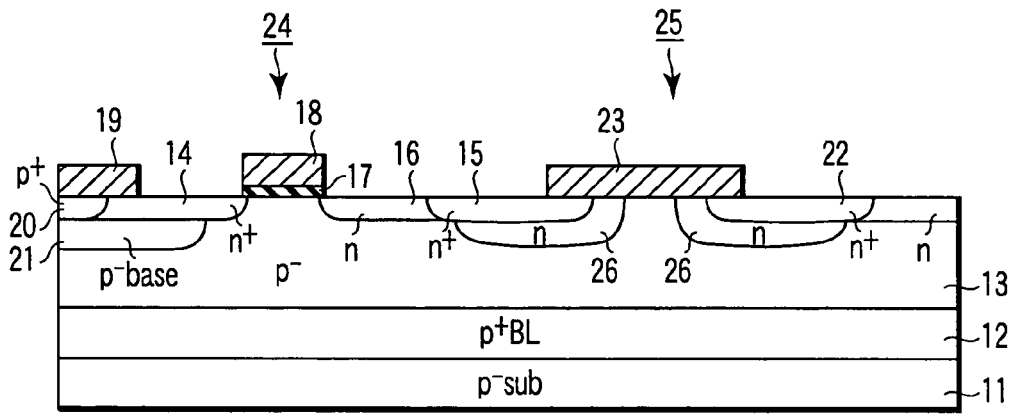
F I G. 5
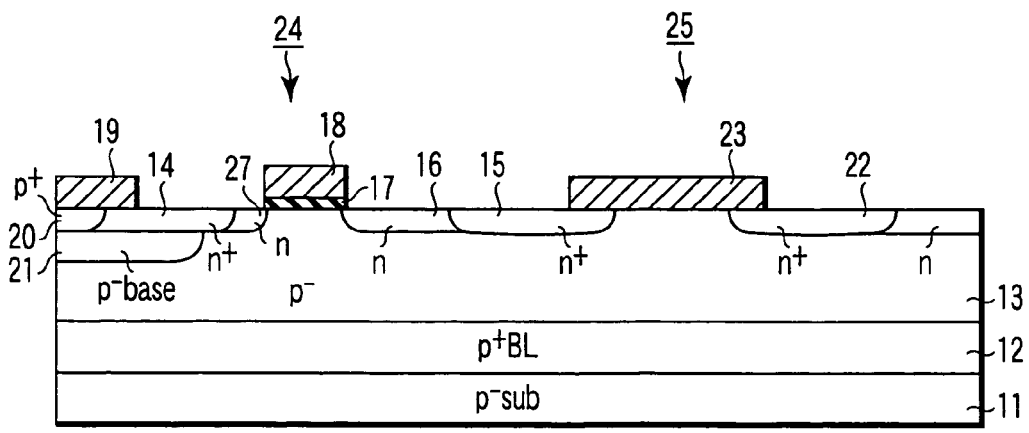
F I G. 6

US 7,432,579 B2

SEMICONDUCTOR DEVICE WITH HORIZONTAL MOSFET AND SCHOTTKY BARRIER DIODE PROVIDED ON SINGLE SUBSTRATE

CROSS-REFERENCE TO RELATED APPLICATIONS

This application is based upon and claims the benefit of priority from the prior Japanese Patent Application No. 2003-350819, filed Oct. 9, 2003, the entire contents of which are incorporated herein by reference.

BACKGROUND OF THE INVENTION

1. Field of the Invention

The present invention relates to a semiconductor device with a horizontal MOS field-effect transistor and Schottky barrier diode provided on a single substrate.

2. Description of the Related Art

In the development of DC-DC converters, it is necessary to arrange a low-side MOS field-effect transistor (hereinafter referred to as a "MOSFET") and Schottky barrier diode (hereinafter referred to as an "SBD") in parallel in a driver circuit. If an SBD is provided on the outer surface of a MOSFET, the inductance (L) component of wiring that connects the MOSFET to the SBD significantly increases.

To avoid this, Japanese Patent No. 3272242, for example, has proposed to form a MOSFET and SBD on a single substrate (see FIG. 1).

However, where a MOSFET and SBD are provided on a single substrate as described above, the area for forming the MOSFET and SBD is needed on the substrate, therefore the required chip area cannot be reduced.

BRIEF SUMMARY OF THE INVENTION

According to an aspect of the invention, there is provided a semiconductor device that comprises a MOS field-effect transistor and a Schottky barrier diode. The MOS field-effect transistor includes a semiconductor substrate of a first-conductivity type, a semiconductor layer of the first-conductivity type, a source region of a second-conductivity type, a first drain region of the second-conductivity type, a resurf layer of the second-conductivity type, a gate insulation film and a gate electrode. The semiconductor layer is provided on the semiconductor substrate. The source region is provided in a surface portion of the semiconductor layer. The first drain region is provided in a surface portion of the semiconductor layer separate from the source region. The resurf layer is provided in a surface portion of the semiconductor layer between the source region and the first drain region. Further, the resurf layer is in contact with the first drain region and has a lower impurity concentration than the first drain region. The gate electrode is provided on the semiconductor layer between the source region and resurf layer, with the gate insulation film interposed. The Schottky barrier diode includes a second drain region of the second-conductivity type, and a Schottky electrode. The second drain region is provided in a surface portion of the semiconductor layer separate from the first drain region in a direction away from the gate electrode. The Schottky electrode is provided on the semiconductor layer between the first and second drain regions

BRIEF DESCRIPTION OF THE SEVERAL VIEWS OF THE DRAWING

FIG. 4 is a sectional view illustrating the structure of a semiconductor device according to a third modification of the first embodiment;

FIG. 5 is a sectional view illustrating the structure of a semiconductor device according to a second embodiment of the invention;

FIG. 6 is a sectional view illustrating the structure of a semiconductor device according to a third embodiment of the invention;

DETAILED DESCRIPTION OF THE INVENTION

Figure 1:
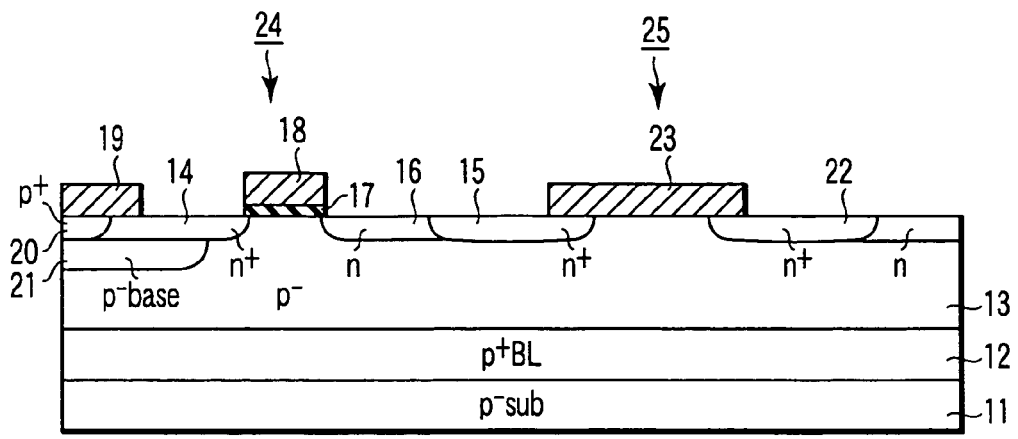
FIG. 1 is a sectional view illustrating the structure of a semiconductor device according to a first embodiment of the invention.

Embodiments in which a MOSFET and SBD are provided on a single substrate will be described in detail with reference to the accompanying drawings. In the drawings, like reference numerals denote like elements.

First Embodiment

A semiconductor device according to a first embodiment of the invention will be described. FIG. 1 shows the semiconductor device of the first embodiment.

As shown, a $p^+$-type buried layer 12 is provided on a p-type semiconductor substrate 11. A $p^-$-type layer 13 is provided on the $p^+$-type buried layer 12. An $n^+$-type layer as a source region 14 and an $n^+$-type layer as a drain region 15 are provided in separate surface portions of the $p^-$-type layer 13. A resurf layer (n-type layer) 16 is provided between the source region 14 and drain region 15 in contact with the drain region 15.

A gate insulation film 17 is provided on the p⁻-type layer (channel region) 13 between the source region 14 and resurf layer 16. A gate electrode 18 is provided on the gate insulation film 17.

A source electrode 19 is provided on the source region 14, and a p⁺-type layer 20 is provided just below the source electrode 19. Further, a p-type base layer 21 is provided just below the source region 14 and p⁺-type layer 20.

Another drain region 22 is formed at a predetermined distance from the drain region 15. A Schottky electrode 23 is provided on the drain regions 15 and 22 and on the portion of the p⁻-type layer 13 located therebetween.

The p⁻-type layer 13, source region 14, drain region 15, resurf layer 16, gate insulation film 17 and gate electrode 18 form an n-channel MOSFET 24. Further, the p⁻-type layer 13, Schottky electrode 23, p⁺-type layer 20 and p-type base layer 21 form a Schottky barrier diode 25.

In the structure of FIG. 1, the n-channel MOSFET 24 and SBD 25 are formed integral on the semiconductor substrate 11, and the drain region 15 of the n-channel MOSFET 24 also serves as the n⁺-type layer 15 of the SBD 25. In other words, the n⁺-type layer 15 is used as the drain region of the n-channel MOSFET 24 and electrically connected to the Schottky electrode 23 of the SBD 25.

In the semiconductor device of the first embodiment constructed as the above, since the n-channel MOSFET and SBD are formed on a single semiconductor substrate, the inductance component of the wiring that connects the n-channel MOSFET to the SBD can be reduced. Furthermore, since the drain region of the n-channel MOSFET is also used as an n⁺-type layer electrically connected to the Schottky electrode of the SBD, i.e., since an n⁺-type layer is commonly used for the n-channel MOSFET and SBD, the area on the semiconductor substrate needed for the n-channel MOSFET and SBD can be reduced. Furthermore, since the resurf layer 16 is formed between the drain region 15 and channel region, the breakdown voltage of the n-channel MOSFET during the application of a reverse bias can be increased.

Figure 2:
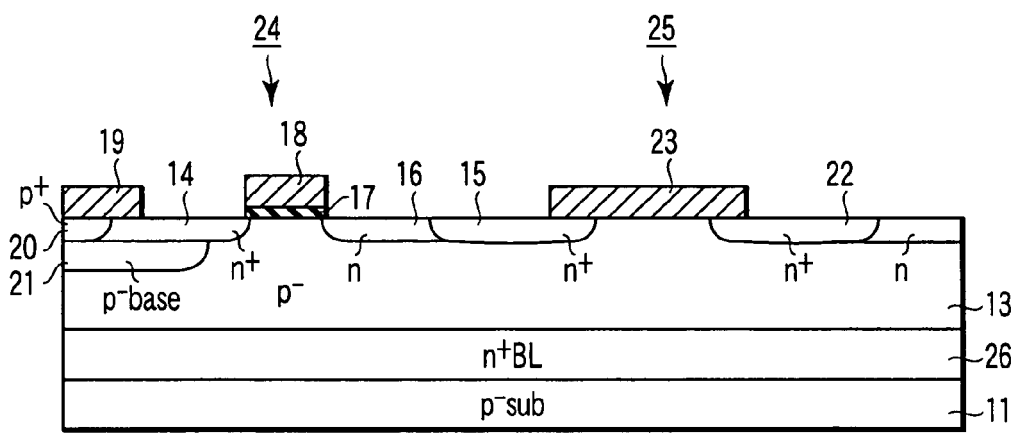
FIG. 2 is a sectional view illustrating the structure of a semiconductor device according to a first modification of the first embodiment.

A description will now be given of a first modification of the first embodiment. FIG. 2 is a sectional view illustrating the structure of a semiconductor device according to the first modification.

As seen from FIG. 2, an n⁺-type buried layer 26 is provided on the p-type substrate 11, instead of the p⁺-type buried layer 12. Where the n⁺-type buried layer 26 is provided, the potential of the layer 26 can be fixed by, for example, forming a deep n⁺ layer diffusing from the surface of a peripheral portion of an element, and connecting this layer to the layer 26. The other structure and advantage are similar to those of the first embodiment shown in FIG. 1. In FIGS. 1 and 2, the p-type semiconductor substrate 11 may be replaced with an n-type semiconductor substrate.

Figure 3:
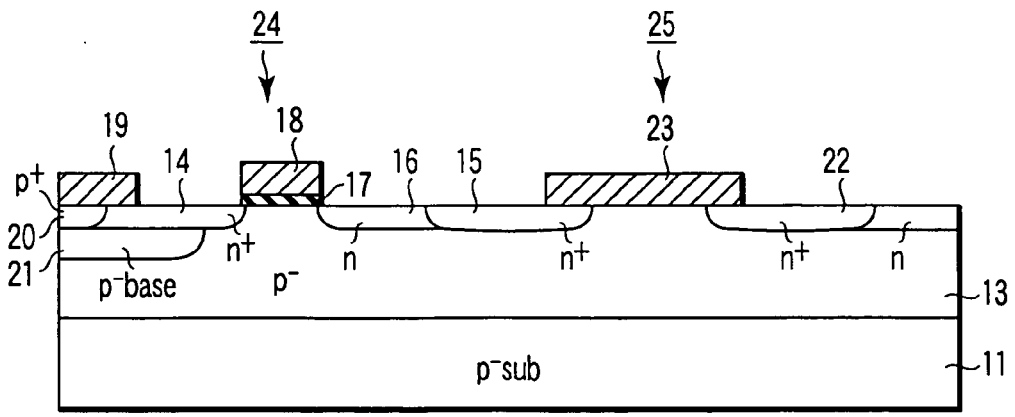
FIG. 3 is a sectional view illustrating the structure of a semiconductor device according to a second modification of the first embodiment.

FIG. 3 is a sectional view illustrating the structure of a semiconductor device according to a second modification of the first embodiment.

As seen from FIG. 3, a p⁻-type layer 13 is directly provided on the p-type semiconductor substrate 11. No p-type buried layer 12 is provided between the p-type semiconductor substrate 11 and p⁻-type layer 13. The other structure and advantage are similar to those of the first embodiment shown in FIG. 1.

Furthermore, as in the third modification shown in FIG. 4, the p-type semiconductor substrate 11 may be replaced with an n-type semiconductor substrate 27. In this case, also, the element comprising the p⁻-type layer 13 has the same structure as the above, therefore an advantage similar to the above-mentioned one can be obtained. As described above, concerning the portion below the p⁻-type layer 13, the substrate may be of the p- or n-type, the buried layer may be employed or not, and if the buried layer is employed, it may be of the p- or n-type.

Second Embodiment

A semiconductor device according to a second embodiment will be described, referring only to the differences between the first and second embodiments.

FIG. 5 is a sectional view illustrating the structure of the semiconductor device of the second embodiment.

The second embodiment incorporates, in addition to the structure shown in FIG. 1, an n-type layer 26 having a lower concentration than an n⁺-type layer is provided just below the n⁺-type layers 15 and 22 of the SBD and the Schottky electrode 23.

The characteristics and leakage current of the SBD can be controlled by controlling the position of the n-type layer 26 to thereby adjust the contact area of the p⁻-type layer 13 and Schottky electrode 23. If the contact area is reduced, the leakage current of the SBD can be reduced.

Further, since the n-type layer 26 extends to a deeper position than the n⁺-type layer, it can block the electric field that occurs in the Schottky junction. When the electric field is blocked, the current leaking to the SBD is reduced.

In the second embodiment, concerning the portion below the p⁻-type layer 13, the substrate may be of the p- or n-type, the buried layer may be employed or not, and if the buried layer is employed, it may be of the p- or n-type, as in the first and second modifications of the first embodiment.

Third Embodiment

A semiconductor device according to a third embodiment will be described, referring only to the differences between the first and third embodiments.

FIG. 6 is a sectional view illustrating the structure of the semiconductor device of the third embodiment.

As shown in FIG. 6, between the source region 14 and drain region 15, the resurf layer (n-type layer) 16 is provided in contact with the drain region 15, and further another resurf layer (n-type layer) 27 is provided in contact with the source region 14.

The gate insulation film 17 is provided on the p⁻-type layer (channel region) 13 between the resurf layers 16 and 27, and the gate electrode 18 is provided on the gate insulation film 17. The other structure is similar to that of the first embodiment shown in FIG. 1.

The provision of the resurf layer 27 implies the addition of a resistance to the source, which reduces the leakage current in the n-channel MOSFET. Further, the provision of the resurf layer 27 increases the ON resistance of the n-channel MOSFET. However, when a plurality of MOSFETs are provided, the provision of the resurf layer 27 makes it easy to impart substantially the same ON resistance to the MOSFETs. In other words, the provision of the resurf layer 27 reduces the range of variations in the ON resistance between the MOSFETs.

In the third embodiment, concerning the portion below the p⁻-type layer 13, the substrate may be of the p- or n-type, the buried layer may be employed or not, and if the buried layer is employed, it may be of the p- or n-type, as in the first and second modifications of the first embodiment. Furthermore, the n-type layer 26 of a lower concentration than an n⁺-type layer may be provided just below the n⁺-type layers 15 and 22 of the SBD and the Schottky electrode 23.

Fourth Embodiment

A semiconductor device according to a fourth embodiment will be described. The first embodiment shown in FIG. 1 is directed to a structure in which a Schottky barrier diode having a Schottky junction on the drain side is formed. On the other hand, in the fourth embodiment, a Schottky barrier diode having a Schottky junction on the source side is formed.

Figure 7:
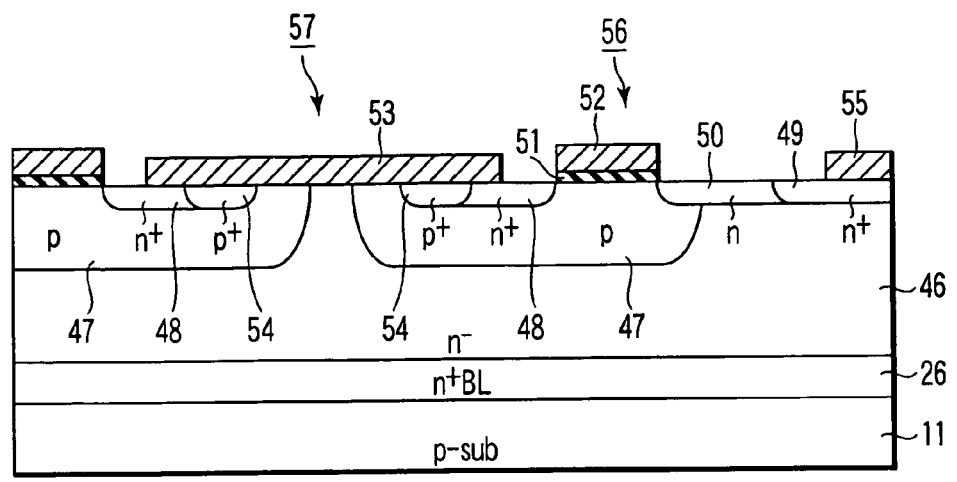
FIG. 7 is a sectional view illustrating the structure of a semiconductor device according to a fourth embodiment of the invention.

FIG. 7 is a sectional view illustrating the structure of a semiconductor device according to the fourth embodiment of the invention.

As shown in FIG. 7, an $n^+$-type buried layer 26 is formed on a p-type semiconductor substrate 11, and an $n^-$-type layer 46 is formed on the $n^+$-type buried layer 26. A p-type base layer 47 is formed in the surface of the $n^-$-type layer 46. An $n^+$-type layer serving as a source region 48 is formed in the surface of the p-type base layer 47. An $n^+$-type layer serving as a drain region 49 is formed in the surface of the $n^-$-type layer 46, separate from the source region 48. Further, a resurf layer (n-type layer) 50 is formed between the source region 48 and drain region 49 in contact with the drain region 49.

A gate insulation film 51 is formed on the p-type base layer 47 between the source region 48 and resurf layer 50, i.e., on the channel region, and a gate electrode 52 is formed on the gate insulation film 51.

A source electrode (Schottky electrode) 53 is formed on the source region 48, p-type base layer 47 and $n^-$-type layer 46. A drain electrode 55 is formed on the drain region 49.

The above-mentioned p-type base layer 47, source region 48, drain region 49, resurf layer 50, gate insulation film 51 and gate electrode 52 provide an n-channel MOSFET 56. Further, the $n^-$-type layer 46, Schottky electrode 53 and drain region 49 provide a Schottky barrier diode (SBD) 57.

In the structure of FIG. 7, the n-channel MOSFET 56 and SBD 57 are formed integrally with each other on a single semiconductor substrate, and the $n^+$-type layer (drain region) 49 is commonly used by the n-channel MOSFET 56 and SBD 57.

In the above-described semiconductor device of the fourth embodiment, the n-channel MOSFET 56 and SBD 57 are formed on a single semiconductor substrate. This means that the semiconductor device needs no wire for connecting them, and is therefore free of the inductance component of the wire. Further, since the drain region of the n-channel MOSFET is also used as the $n^+$-type layer connected to the Schottky electrode of the SBD, the area in the semiconductor substrate needed for forming the n-channel MOSFET and SBD can be reduced. Furthermore, the resurf layer 50 formed between the drain region 49 and channel region enhances the breakdown voltage of the n-channel MOSFET when a bias is applied thereto. In addition, the impurity dose of the p-type base layer 47 is set larger than that of the resurf layer 50, and smaller than that of a $p^+$-type diffusion layer 54. That is, the impurity concentration of the p-type base layer 47 is set higher than that of the resurf layer 50, and lower than that of the $p^+$-type diffusion layer 54. In this case, if no space is defined between the p-type base layer 47 and $n^+$-type diffusion layer 49, a strong electric field is formed therebetween and hence the breakdown voltage is reduced. To avoid this, the p-type base layer 47 and $n^+$-type diffusion layer 49 are prevented from contacting each other.

Fifth Embodiment

A semiconductor device according to a fifth embodiment of the invention will be described. In particular, the difference between the fifth embodiment and fourth embodiment will be described.

Figure 8:
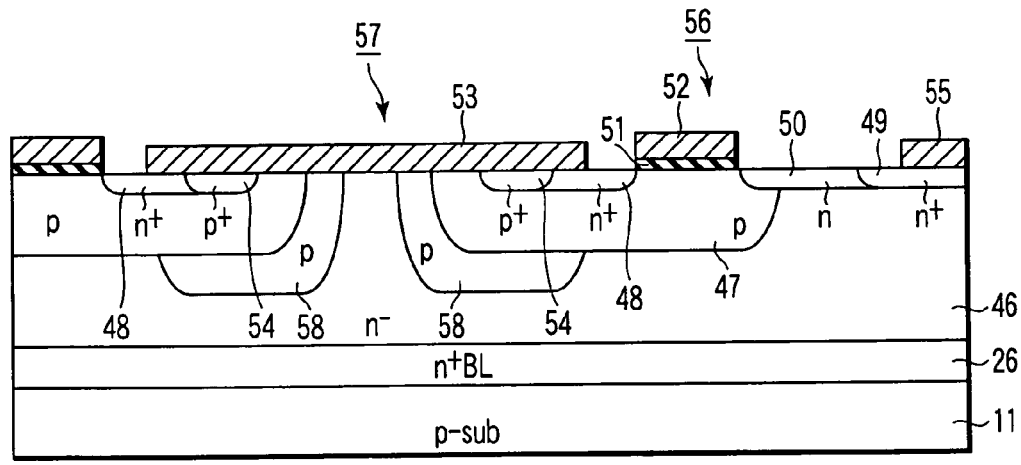
FIG. 8 is a sectional view illustrating the structure of a semiconductor device according to a fifth embodiment of the invention.

FIG. 8 is a sectional view illustrating the structure of the semiconductor device according to the fifth embodiment. As shown, under the Schottky electrode 53, a p-type layer 58 is formed along side and bottom portions of the p-type base region 47, extending to a deeper position than the base region 47. Further, the p-type layer 58 has a lower impurity concentration than the $p^+$-type layer 54. The other structures of the fifth embodiment are similar to the fourth embodiment shown in FIG. 7.

As described above, in the fifth embodiment, the p-type layer 58 having a lower impurity concentration than the $p^+$-type layer 54 and contacting the Schottky electrode 53 is provided in the vicinity of the p-type base layer 47 having a Schottky junction. The p-type layer 58 extends to a deeper position than the p-type base layer 47. This arrangement of the p-type layer 58 weakens the electric field near the Schottky junction, and further reduces the current leaking to the SBD 57 than in the fourth embodiment.

Sixth Embodiment

A semiconductor device according to a sixth embodiment of the invention will be described. In particular, the difference between the sixth embodiment and fourth embodiment will be described.

Figure 9:
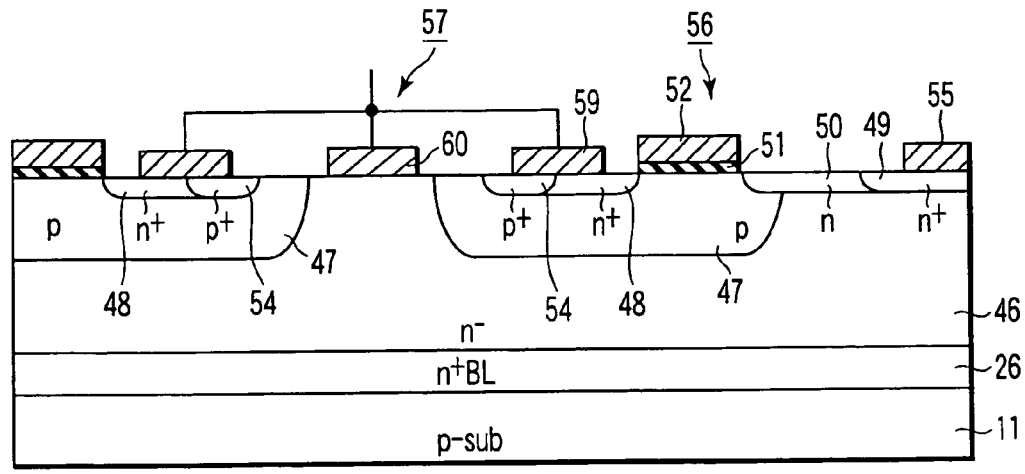
FIG. 9 is a sectional view illustrating the structure of a semiconductor device according to a sixth embodiment of the invention.

FIG. 9 is a sectional view illustrating the structure of the semiconductor device according to the sixth embodiment. As shown, a source electrode 59 is formed on the source region 48, and a Schottky electrode 60 is formed on the $n^-$-type layer 46 near the p-type base layer 47. The source electrode 59 and Schottky electrode 60 are electrically connected by the uppermost wiring layer.

In the Schottky barrier diode (SBD) 57, the Schottky electrode 60 for providing a Schottky junction is formed of a material different from that of the source electrode 59, drain electrode 55 and gate electrode 52. Specifically, assuming that the work function of the material of the Schottky electrode 60 is $\phi$, and the electron affinity of the semiconductor material of the $n^-$-type layer 46 is x, an electrode material having a high "$\phi$-x" value is used for the Schottky electrode 60. As a result, the current leaking to the SBD 57 can be reduced.

If an electrode material having a high "$\phi$-x" value is used for the source electrode 59, drain electrode 55 and gate electrode 52, the contact resistance between each of the electrodes and the semiconductor layer is increased. To prevent the contact resistance from adversely affecting the ON-resistance of the n-channel MOSFET 56, an electrode material having a low "$\phi$-x" value is used for the source electrode 59, drain electrode 55 and gate electrode 52.

In the fourth embodiment, a single electrode is used as both the source electrode and Schottky electrode. On the other hand, as described above, in the sixth embodiment, the source electrode 59 is located separately from the Schottky electrode 60. Further, the Schottky electrode 60 is formed of a material different from that of the other electrodes (source electrode 59, drain electrode 55 and gate electrode 52). That is, an electrode material having a high "$\phi$-x" value is used for the Schottky electrode 60, and an electrode material having a low "$\phi$-x" value is used for the source electrode 59, drain electrode 55 and gate electrode 52. The "$\phi$-x" value of the material of the Schottky electrode 60 is higher than that of the source electrode 59, drain electrode 55 and gate electrode 52. For example, molybdenum (Mo), cobalt (Co) and tungsten (W) are materials having a high "φ-x" value. These arrangements can reduce the current leaking to the SBD 57, and reduce ON-resistance of the n-channel MOSFET 56.

Seventh Embodiment

A semiconductor device according to a seventh embodiment of the invention will be described. In particular, the difference between the seventh embodiment and fourth embodiment will be described. The seventh and fourth embodiments differ from each other in the structure of the n-channel MOSFET 56.

Figure 10:
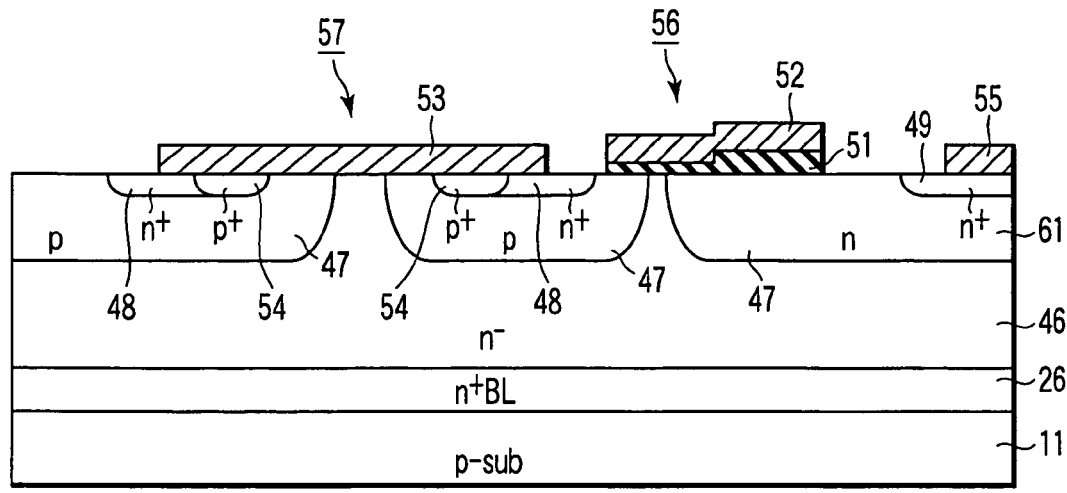
FIG. 10 is a sectional view illustrating the structure of a semiconductor device according to a seventh embodiment of the invention.

FIG. 10 is a sectional view illustrating the structure of the semiconductor device according to the seventh embodiment. In the fourth embodiment shown in FIG. 7, the resurf layer (n-type layer) 50 is formed so that it does not overlap with the gate electrode 52. However, in the seventh embodiment, a resurf layer (n-type layer) 61 overlaps with the gate electrode 52 as shown in FIG. 10. The portion of a gate insulation film 51 located on the resurf layer 61 is thicker than that of the film 51 located on the p-type base layer 47, and the gate electrode 52 is provided on the gate insulation film 51 of an ununiform thickness. The other structures are similar to those in the fourth embodiment.

The above structure can weaken the electric field concentrated on the end portion of the gate electrode 52, whereby the impurity concentration of the resurf layer 61 can be increased. This structure can reduce the ON-resistance of the n-channel MOSFET 56.

Eighth Embodiment

A semiconductor device according to an eighth embodiment of the invention will be described. In particular, the difference between the eighth embodiment and fourth embodiment will be described.

Figure 11:
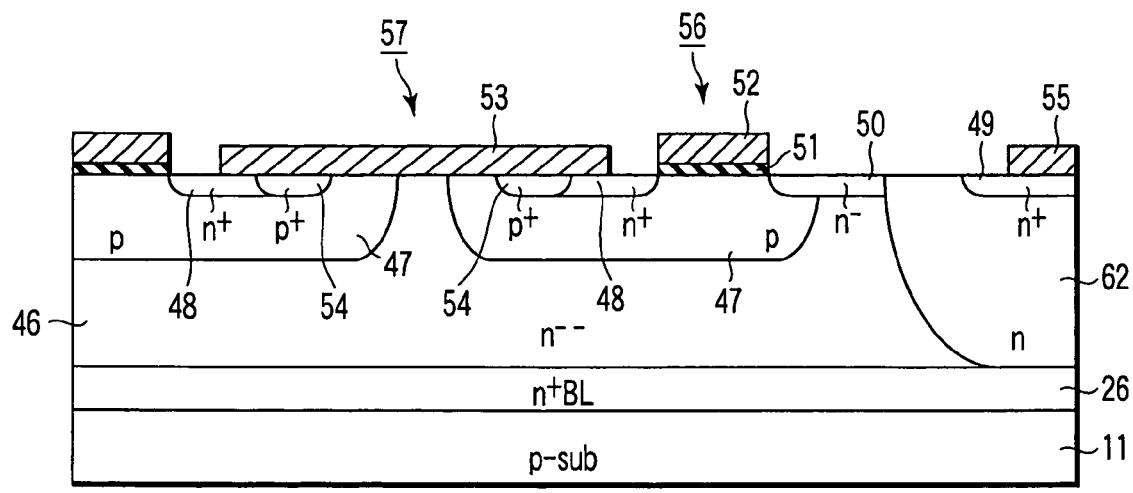
FIG. 11 is a sectional view illustrating the structure of a semiconductor device according to an eighth embodiment of the invention.

FIG. 11 is a sectional view illustrating the structure of the semiconductor device according to the eighth embodiment. The eighth embodiment differs from the fourth embodiment of FIG. 7 in that in the former, a deep n-type layer 62 is formed between the drain region 49 and resurf layer 50 and between the drain region 49 and n$^+$-type buried layer 26. The other structures are similar to those of the fourth embodiment. In the example of FIG. 11, to clarify the relationship in impurity concentration between the n-type layers, the n$^-$-type layer 46 and n-type resurf layer 50 in FIG. 7 are shown as the n$^-$-type layer 46 and n$^-$-type resurf layer 50, respectively.

In the eighth embodiment, since the deep n$^+$-type layer 62 is provided under the drain region 49 and between the layer 49 and resurf layer 50, the electric resistance of the portion extending from the Schottky electrode 53 to the drain region 49 via the n$^-$-type layer 46 and deep n$^+$-type layer 62 can be reduced. As a result, the electric resistance of the Schottky diode 57 can be reduced.

Ninth Embodiment

A semiconductor device according to a ninth embodiment will be described, referring only to the differences between the first and ninth embodiments.

Figure 12:
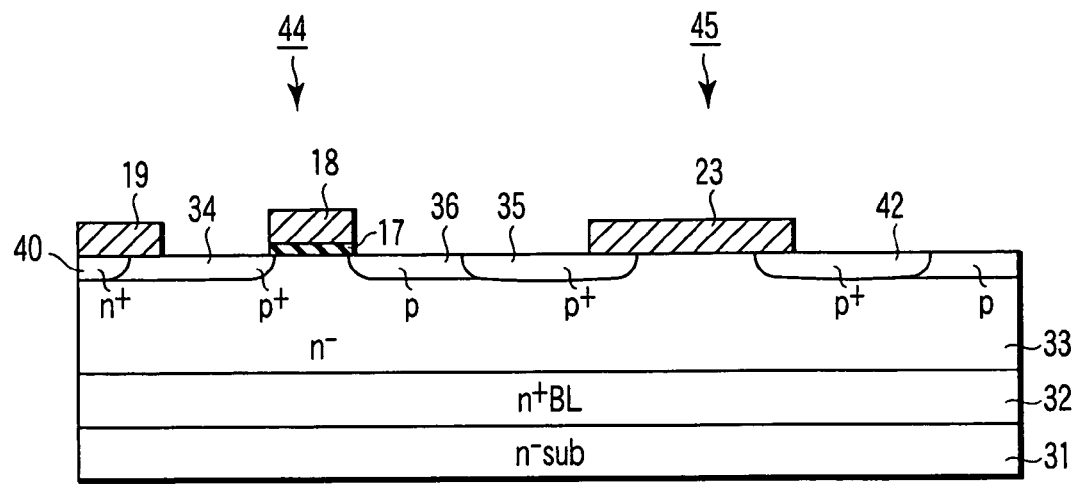
FIG. 12 is a sectional view illustrating the structure of a semiconductor device according to a ninth embodiment of the invention.

FIG. 12 is a sectional view illustrating the structure of the semiconductor device of the ninth embodiment.

As shown in FIG. 12, the conductivity types of all elements employed in the ninth embodiment are opposite to those of the corresponding elements employed in the first embodiment. In other words, an n-type buried layer 32 and n$^-$-type layer 33 are provided in this order on a n-type semiconductor substrate 31. A p-channel MOSFET 44 and Schottky barrier diode 45 are provided on surface portions of the n$^-$-type layer 33. The p-channel MOSFET 44 and Schottky barrier diode 45 will be described in detail.

A p$^+$-type layer as a source region 34 and a p$^+$-type layer as a drain region 35 are provided in separate surface portions of the n$^-$-type layer 33. A resurf layer (p-type layer) 36 is provided between the source region 34 and drain region 35 in contact with the drain region 35.

A gate insulation film 17 is provided on the n$^-$-type layer (channel region) 33 between the source region 34 and resurf layer 36. A gate electrode 18 is provided on the gate insulation film 17. A source electrode 19 is provided on the source region 34, and a n$^+$-type layer 40 is provided just below the source electrode 19.

Further, another drain region 42 is formed at a predetermined distance from the drain region 35. A Schottky electrode 23 is provided on the drain regions 35 and 42 and on the portion of the n$^-$-type layer 33 located therebetween.

The n$^-$-type layer 33, source region 34, drain region 35, resurf layer 36, gate insulation film 17 and gate electrode 18 form a p-channel MOSFET 44. Further, the n$^-$-type layer 33, Schottky electrode 23 and source region 34 form a Schottky barrier diode 45.

In the structure of FIG. 12, the p-channel MOSFET 44 and SBD 45 are formed integral on the semiconductor substrate 31, and the drain region 35 of the p-channel MOSFET 44 also serves as the p$^+$-type layer 35 of the SBD 45. In other words, the p$^+$-type layer 35 is used as the drain region of the p-channel MOSFET 44 and electrically connected to the Schottky electrode 23 of the SBD 45.

In the semiconductor device of the ninth embodiment constructed as the above, since the p-channel MOSFET and SBD are formed on a single semiconductor substrate, the inductance component of the wiring that connects the p-channel MOSFET to the SBD can be reduced. Furthermore, since the drain region of the p-channel MOSFET is also used as a p$^+$-type layer electrically connected to the Schottky electrode of the SBD, i.e., since a p$^+$-type layer is commonly used for the p-channel MOSFET and SBD, the area on the semiconductor substrate that is needed for forming the p-channel MOSFET and SBD can be reduced. Also, since the resurf layer 36 is provided between the drain region 35 and channel region, the breakdown voltage of the p-channel MOSFET during the application of a reverse bias can be increased.

In the ninth embodiment, concerning the portion below the p$^-$-type layer 33, the substrate may be of the p- or n-type, the buried layer may be employed or not, and if the buried layer is employed, it may be of the p- or n-type, as in the first and second modifications of the first embodiment.

Figure 13:
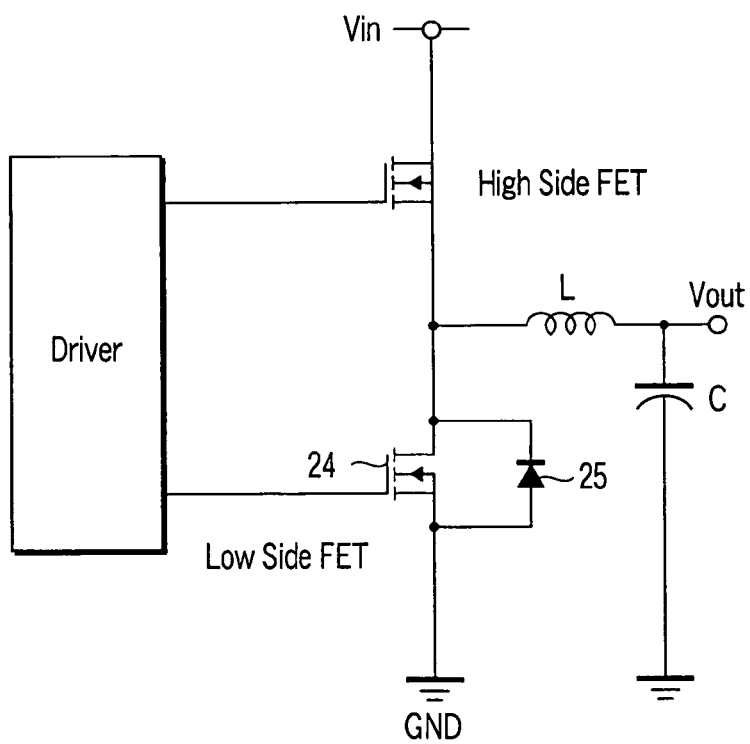
FIG. 13 is a circuit diagram illustrating a driver circuit that incorporates the semiconductor device according to each of the first to eighth embodiments.

FIG. 13 shows a structure example of a driver circuit incorporated in the above-described semiconductor devices of the first to eighth embodiments.

As described above, the invention aims to provide a semiconductor device that has a MOSFET and SBD formed integral as one body, therefore requires a small chip area and shows a low parasitic inductance.

In addition, the above-described embodiments can be carried out individually or in combination. Each of the embodiments contains inventions of various stages. These inventions can be extracted by appropriately combining the structural elements disclosed in each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising a MOS field-effect transistor and a Schottky barrier diode,
   the MOS field-effect transistor including:
   a semiconductor substrate of a first-conductivity type;
   a semiconductor layer of a second-conductivity type on the semiconductor substrate;
   a base region of the first-conductivity type provided in a surface portion of the semiconductor layer;
   a source region of the second-conductivity type provided in a surface portion of the base region;
   a drain region of the second-conductivity type provided in a surface portion of the semiconductor layer separately from the source region;
   a resurf layer of the second-conductivity type provided in a surface portion of the semiconductor layer between the source region and the drain region, the resurf layer having a lower impurity concentration than the drain region;
   a gate insulation film provided on the base region between the source region and the resurf layer; and
   a gate electrode provided on the gate insulation film, the Schottky barrier diode including:
   a Schottky electrode provided on the source region and the semiconductor layer,
   wherein the drain region is part of both the MOS field-effect transistor and the Schottky barrier diode,
   the Schottky electrode is in contact with the semiconductor layer, and
   the device further includes a second semiconductor region of the first-conductivity type provided near the base region under the Schottky electrode, the second semiconductor region extending to a deeper position than the base region.

2. The semiconductor device according to claim 1, further comprising a low-resistance layer of the second-conductivity type provided between the semiconductor substrate and the semiconductor layer and having a higher impurity concentration than the semiconductor layer.

3. The semiconductor device according to claim 1, further comprising a first semiconductor region of the first-conductivity type pro in a surface portion of the base region and having a higher impurity concentration than the base region,
the Schottky electrode being provided on the base region and the first semiconductor region.

4. The semiconductor device according to claim 1, further comprising a first semiconductor region of the first-conductivity type provided in a surface portion of the base region, the base region having an impurity concentration higher than the resurf layer and lower than the first semiconductor region.

5. A semiconductor device comprising a MOS field-effect transistor and a Schottky barrier diode,
   the MOS field-effect transistor including:
   a semiconductor substrate of a first-conductivity type;
   a semiconductor layer of a second-conductivity type on the semiconductor substrate;
   a base region of the first-conductivity type provided in a surface portion of the semiconductor layer;
   a source region of the second-conductivity type provided in a surface portion of the base region;
   a drain region of the second-conductivity type provided in a surface portion of the semiconductor layer separately from the source region;
   a resurf layer of the second-conductivity type provided in a surface portion of the semiconductor layer between the source region and the drain region, the resurf layer having a lower impurity concentration than the drain region;
   a gate insulation film provided on the base region between the source region and the resurf layer; and
   a gate electrode provided on the gate insulation film, the Schottky barrier diode including:
   a Schottky electrode provided on the source region and the semiconductor layer;
   a first semiconductor region of the first-conductivity type provided in a surface portion of the base region and having a higher impurity concentration than the base region, the Schottky electrode being provided on the base region and the first semiconductor region; and
   a second semiconductor region of the first-conductivity type provided near the base region under the Schottky electrode, the second semiconductor region extending to a deeper position than the base region.

6. The semiconductor device according to claim 5, further comprising a low-resistance layer of the second-conductivity type provided between the semiconductor substrate and the semiconductor layer and having a higher impurity concentration than the semiconductor layer.

7. The semiconductor device according to claim 5, wherein the base region has an impurity concentration higher than the resurf layer and lower than the first semiconductor region.

* * * * *